United States Patent
Acharya et al.

[19]

[11] Patent Number: 6,055,184
[45] Date of Patent: Apr. 25, 2000

[54] SEMICONDUCTOR MEMORY DEVICE HAVING PROGRAMMABLE PARALLEL ERASE OPERATION

[75] Inventors: Pramod Acharya, Vileparle; Jayanta Lahiri, Calcutta, both of India; Nathan Moon, Dallas, Tex.

[73] Assignee: Texas Instruments Incorporated, Dallas, Tex.

[21] Appl. No.: 09/388,046

[22] Filed: Sep. 1, 1999

Related U.S. Application Data

[60] Provisional application No. 60/098,850, Sep. 2, 1998.

[51] Int. Cl.[7] .................................................. G11C 16/04
[52] U.S. Cl. ................................ 365/185.11; 365/185.29
[58] Field of Search ........................ 365/185.11, 185.22, 365/185.29, 185.31

[56] References Cited

U.S. PATENT DOCUMENTS

| | | | |
|---|---|---|---|
| 5,418,752 | 5/1995 | Harari et al. ............................ | 365/218 |
| 5,774,398 | 6/1998 | Ishida .................................. | 365/185.11 |
| 5,787,037 | 7/1998 | Amanai .............................. | 365/185.18 |
| 5,862,079 | 1/1999 | Jinbo .................................. | 365/185.29 |

*Primary Examiner*—Son Mai
*Attorney, Agent, or Firm*—Robby T. Holland; Carlton H. Hoel; Frederick J. Telecky, Jr.

[57] ABSTRACT

A flash electrically erasable and programmable read only memory (EEPROM) having a selective parallel sector erase capability (100) is disclosed. The flash EEPROM (100) includes a number of sectors (104-0 to 104-18), each of which receives an erase voltage (VCC) by way of a source switch circuit (112-0 to 112-18). The source switch circuits (112-0 to 112-18) are each enabled by logic values stored in corresponding tag registers (114-0 to 114-18). The logic values stored by the tag registers (114-0 to 114-18) can be established by the application of particular address values (A12 to A18). The logic values of the tag registers (114-0 to 114-18) can be simultaneously reset to the same value by the application of other address values (A9).

12 Claims, 3 Drawing Sheets

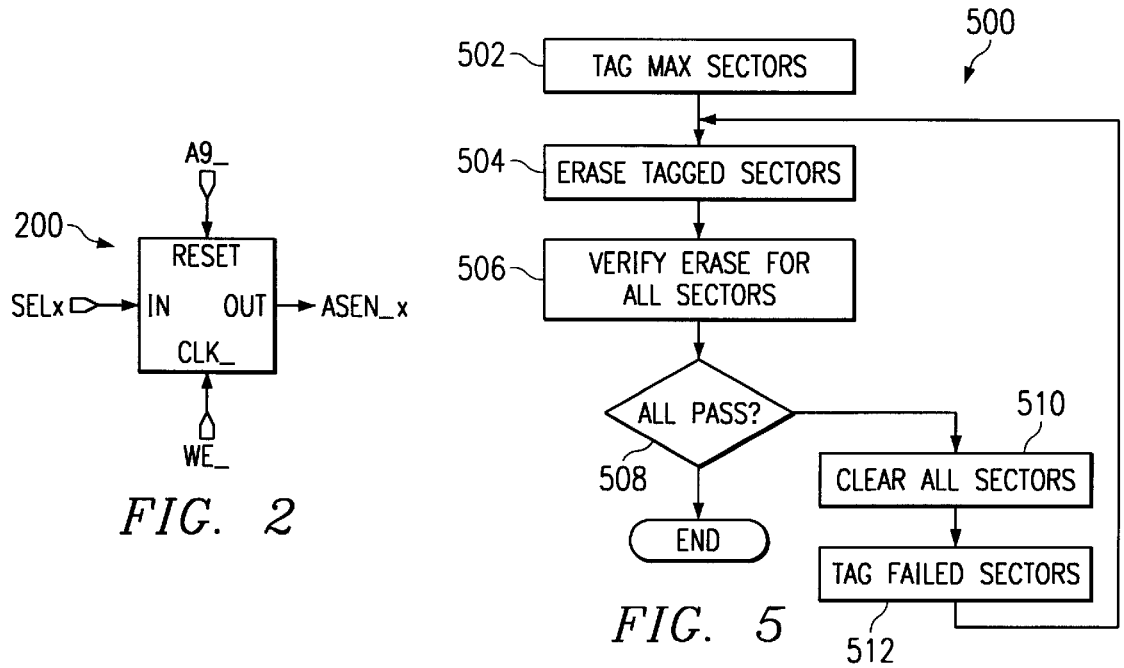
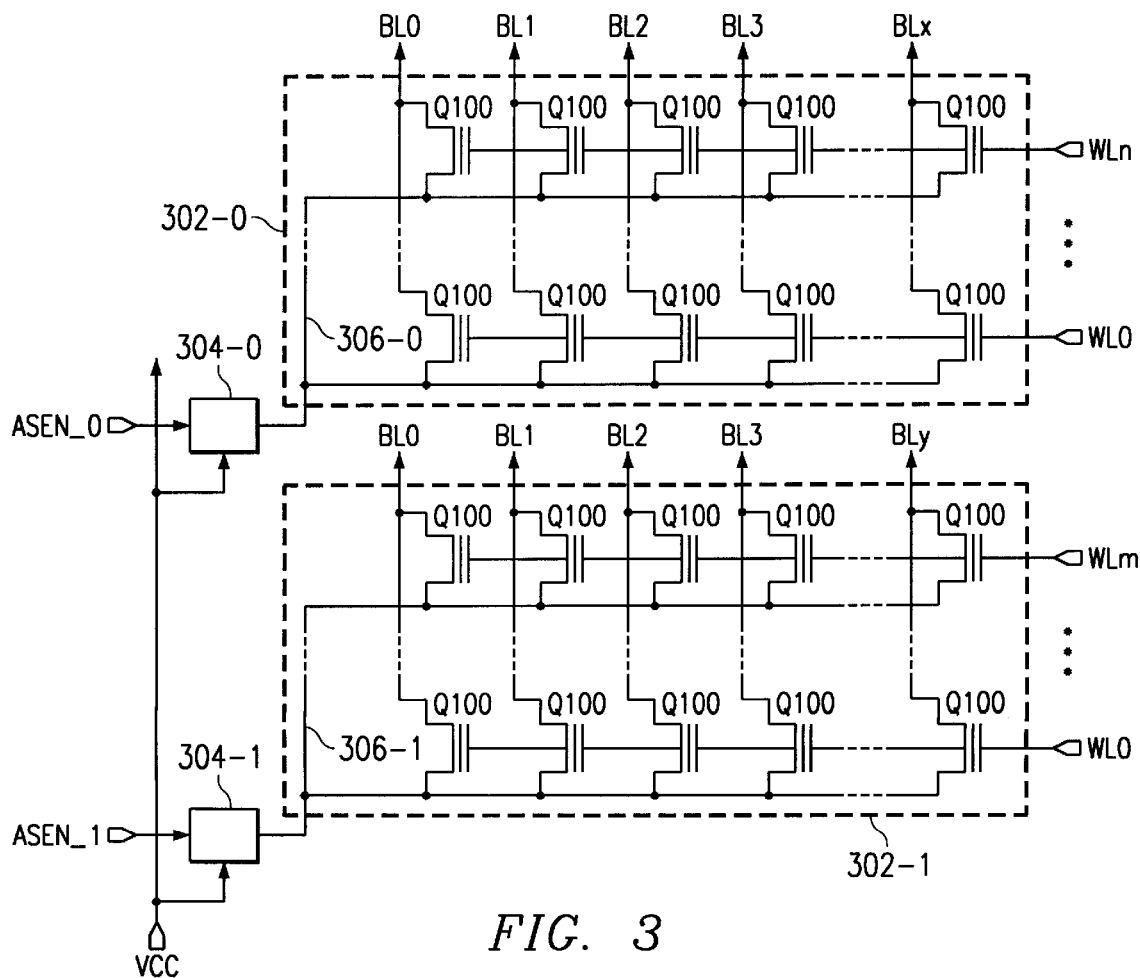

SEMICONDUCTOR MEMORY DEVICE HAVING PROGRAMMABLE PARALLEL ERASE OPERATION

This application claims priority under 35 USC §119(e)(1) of provisional application Ser. No. 60/098,850 filed Sep. 2, 1998.

TECHNICAL FIELD

The present invention relates generally to semiconductor memory devices, and more particularly to erase operations for flash electrically programmable and erasable read only memories (EEPROMs).

BACKGROUND OF THE INVENTION

Read only memories (ROMs) typically serve as a nonvolatile source of data storage. Volatile memory devices, such as dynamic random access memories (DRAMs) and static random access memories (SRAMs) can store data, but once power is removed from such devices, the data is lost. In contrast, nonvolatile memory devices, such as ROMs, electrically programmable ROMs (EPROMs), and electrically erasable and programmable ROMs (EEPROMs) retain data in the absence of power. Because of this, nonvolatile storage devices can be particularly suited for portable battery powered applications where power conservation is at a premium. In addition, nonvolatile storage devices often function to store core system data, such as the basic input-output operating system (BIOS) that is used by an electronic system.

Many EPROMs and EEPROMs achieve nonvolatility through the use of memory cells that employ a "floating" gate structure. A floating gate is a conductive structure surrounded by an insulating material that can store charge, and thus establish a logic value. Commonly, a floating gate is disposed over the channel of a metal-oxide-semiconductor (MOS) transistor structure. In this arrangement, the charge on the floating gate can alter the threshold and/or operation of the MOS structure, and thereby establish one or more logic values.

Two mechanisms that are typically used to place charge on, or remove charge from a floating gate, include "channel" hot electron injection and Fowler-Nordheim tunneling ("tunneling"). Hot electron injection is a common programming mechanism for both EPROMs and EEPROMs memory cells that have floating gates. For example, in the case of an n-channel one-transistor (1-T) "stacked" gate EEPROM cell, the floating gate is disposed between the control gate and channel of a MOS transistor structure. In a program operation, the source is maintained at a low voltage while the drain is biased to a low positive voltage. The control gate is biased to a high positive voltage. In this arrangement, electrons are accelerated from the source toward the drain, and due to the high potential of the control gates, are swept through a dielectric into the floating gate. N-channel 1-T EEPROM cells are often preferred due to their compact size.

Tunneling can be used to program or erase an EEPROM cell. In the case of an n-channel 1-T EEPROM cell, in an erase operation, the drain can be kept floating while the control gate is maintained at a relatively high negative voltage. The source can then be pulsed to a positive voltage. With the negative voltage on the control gate and a positive voltage on the source, electrons on the floating gate can tunnel through a "tunnel" dielectric to the source.

The programming and erase operation of an EEPROM can consume considerable time. In particular, for EEPROM cells that utilize tunneling, the rate at which electrons tunnel is dependent upon the tunnel dielectric thickness and the potential created between the control gate and the substrate. The extent to which the thickness of the tunnel dielectric can be reduced is limited by process capabilities and reliability concerns. Similarly, the magnitude of the potential used to induce tunneling can be limited by charge pump capabilities and reliability concerns. Consequently, the rate at which EEPROM cells can be erased by tunneling is limited. Thus, improvements in the programming and/or erase speeds of an EEPROM have been an important goal in EEPROM designs.

The need for faster erase speeds has led to "flash" EEPROMs (sometimes referred to as flash EPROMs). Flash EEPROMs derive their name from the rapid manner in which they are erased. In a conventional EEPROM, selected memory cells are erased individually, or in limited numbers, such as bytes. Thus, the erasure of an entire conventional EEPROM can be a lengthy process. In contrast, a flash EEPROM allows the simultaneous erasure of large groups of memory cells (sometimes referred to as "blocks," "banks" or "sectors"). Some sectors may be protected, and require a specialized procedure to be accessed for erase.

While EEPROM manufacturing processes continue to improve, at the same time, dimensions continue to shrink and operating speeds continue to increase. Thus, in an attempt to create smaller and faster EEPROM devices, manufacturing defects can still occur. In order to ensure that defective devices are not supplied to customers, EEPROMs are usually tested to ensure their functionality. In the case of flash EEPROMs, due to the rate at which electrons tunnel from the floating gate to the substrate, a test erase operation can consume considerable time, particularly if there are multiple sectors that must be erased one at a time. As just one example, a common eight-megabit (8-Mb) flash EEPROM configuration includes nineteen sectors of varying sizes. In such a device, a test operation would require nineteen erase operations.

One way in which to improve the speed at which test erase operations can be performed is to employ a "chip" erase function. A chip erase function allows every sector on a flash EEPROM to be erased simultaneously. A drawback to chip erase operations is that such operations can often lead to an over-erase condition in one or more EEPROM cells. An over-erase condition exists when too much negative charge is removed from the floating gate of an n-channel 1-T EEPROM cell, resulting in the cell functioning like a depletion mode transistor. The threshold voltages of over-erased cells can be corrected by a repair step which places charge back onto a floating gate (sometimes referred to as "soft program," "heal" or "compaction"). Unfortunately, repair will add even more time onto a test operation. It is therefore highly desirable to avoid over-erasing memory cells altogether.

A second way to address over-erase is to erase on a sector by sector basis, using discrete erase pulses. In this approach, a sector will be erased with an erase pulse and then tested to see if all the memory cells in the sector have been erased. If one or more cells are not erased, a second erase pulse can be applied. This can be repeated until each memory cell in the sector is properly erased. A drawback to this "gradual" erase approach is that it consumes too much time when multiple sectors must be erased.

Yet another drawback to a chip erase operations is the amount of charge required to accomplish such an operation. As noted above, the erase operation may require the control gates of the memory cells within an EEPROM to be charged to a negative gate voltage, while the sources are charged to a positive source voltage. The negative control gate voltage of EEPROMs is usually generated on the EEPROM device itself by charge pump circuits. For large EEPROM devices that have many EEPROM cells, the amount charge necessary to erase the entire chip may exceed the capacity of the charge pump circuit It would be desirable to provide a flash EEPROM that provides for rapid erasure of large numbers of the memory cells, to thereby speed up the EEPROM device test process. Such an erase capability should not be overly susceptible to over-erasing memory cells, or exceed on-chip charge pump capabilities.

SUMMARY OF THE INVENTION

According to the preferred embodiment, a "flash" electrically erasable programmable read-only-memory (EEPROM) includes a number of memory cell sectors, and can selectively erase multiple sectors simultaneously (in parallel). In this manner an initial parallel erase operation can be performed on all of the sectors. The sectors can then each be tested for proper functionality. Those sectors that fail can be tagged, and then subject to a second parallel erase operation. Selective parallel erase operations of smaller and smaller sets of sectors can be repeated until no sector fails an erase test.

According to one aspect of the preferred embodiment, for large capacity devices in which a charge pump circuit cannot supply enough charge to perform a chip erase, a smaller number of sectors can be tagged and then subject to a parallel erase operation.

According to another aspect of the preferred embodiment, a flash EEPROM includes a register associated with each sector. The registers can be cleared simultaneously, and then written into, to select a given register for a parallel erase operation.

According to another aspect of the preferred embodiment, sectors within a flash EEPROM are selected for parallel erase by a set of memory address values.

According to another aspect of the preferred embodiment, sectors within a flash EEPROM are selected for parallel erase by an associated register. The associated registers are cleared by at least one memory address value.

BRIEF DESCRIPTION OF THE DRAWING

FIG. 2 is a block diagram of a tag register that may be used in the preferred embodiment.

FIG. 3 is a block schematic diagram illustrating two memory cell arrays and their associated source switches that may be used in the preferred embodiment.

FIG. 5 is a block diagram illustrating an erase test method according to the preferred embodiment.

DETAILED DESCRIPTION OF THE EMBODIMENTS

The preferred embodiment is a "flash" electrically erasable and programmable read only memory (EEPROM) having a large number of memory cells arranged into sectors. The flash EEPROM allows for the parallel erasure of all, or a selected set of the sectors. The preferred embodiment will be described in a series of diagrams. A timing diagram is provided to illustrate a parallel erase step. In addition, a flowchart is provided to illustrate an erase test method according to the preferred embodiment.

Figure 1:
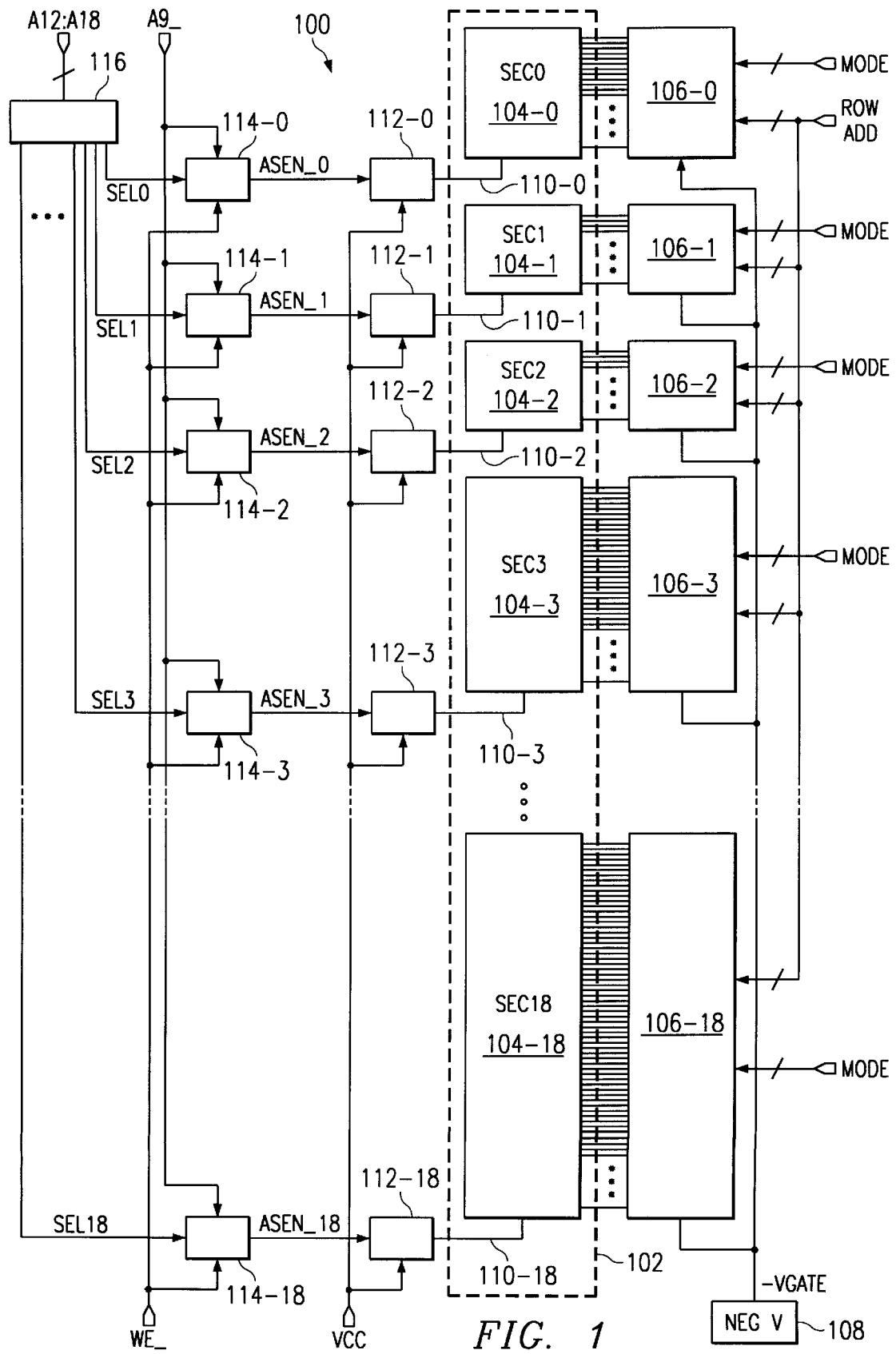
FIG. 1 is block schematic diagram of the preferred embodiment

Referring now to FIG. 1, the preferred embodiment is set forth in a block schematic diagram. The preferred embodiment is utilized in flash EEPROM that includes nineteen sectors. The preferred embodiment is designated by the general reference character 100, and is shown to include a memory cell array 102 that is logically arranged into nineteen sectors, shown as 104-0 to 104-18. Each sector (104-0 to 104-18) includes a particular number of memory cells arranged into rows and columns. Memory cells of the same column within a sector have their drains commonly connected to the same bit line. Memory cells of the same row within a sector have their control gates commonly connected to the same word line. In the particular arrangement of FIG. 1, there are nineteen sectors, one having a 16 kilobyte (kbyte) size, two having 8 kbyte sizes, one having a 32 kbyte size, and 15 having 64 kbyte sizes. Of course, this particular sector size arrangement should not be construed as limiting the present invention.

Associated with each sector (104-0 to 104-18) is a row driver circuit (106-0 to 106-18). Each row driver circuit (106-0 to 106-18) drives a selected row within its sector according to an applied address (ROWADD) and the current mode of operation (MODE). For example, in read mode, one word line will be driven to a relatively low positive voltage according to an applied row address. In a program mode, one word line will be driven to a relatively high positive voltage according to an applied row address. In an erase operation, in order to accomplish the flash erase function, all of the word lines within the sector will be driven to a relatively high negative voltage.

In the particular arrangement of FIG. 1, the relatively high negative voltage utilized by the row driver circuits (106-0 to 106-18) is shown as −Vgate, and is provided by a negative voltage generator circuit 108. The negative voltage generator circuit 108 may be a charge pump circuit or the like.

In the preferred embodiment 100, to accomplish a flash erasure of a sector (104-0 to 104-18), a positive erase operation voltage is applied to the sources of the memory cells within the array. To accomplish this function the preferred embodiment sectors (104-0 to 104-18) each include a common array source (110-0 to 110-18).

As set forth in FIG. 1, each common array source (110-0 to 110-18) is connected to an associated source switch circuit (112-0 to 112-18). Each source switch (112-0 to 112-18), when enabled, provides a low impedance path between a positive voltage (VCC) and its associated common array source (110-0 to 110-18). In this manner, provided the control gates within a sector are receiving the −Vgate voltage, the enabling of a source switch (112-0 to 112-18) will result in an erase pulse being applied to the memory cells of the associated sectors. Each source switch (112-0 to 112-18) is enabled by a corresponding source enable value, shown as signals ASEN_0–ASEN_18. Thus, when the signals ASEN_0–ASEN_18 are all high, all of the sectors (104-0 to 104-18) can be erased simultaneously. It follows that if only a selected group of signals ASEN_0–ASEN_18 is high, only the corresponding group of sectors (104-0 to 104-18) will be erased. For example, if the signals ASEN_2–ASEN_5 and ASEN_8 are high while the remaining signals (ASEN_0–ASEN_1, ASEN_6–ASEN_7, and ASEN_9–ASEN_18) are low, sectors 104-2 to 104-5 and sector 104-8 would be erased, while the remaining sectors are not erased (104-0 to 104-1, 104-6 to 104-7, and 104-9 to 104-18).

The signals ASEN_0–ASEN_18 are provided by a group of "tag" registers (114-0 to 114-18). One tag register (114-0 to 114-18) is associated with each sector (104-0 to 104-18). The tag registers (114-0 to 114-18) are utilized to select ("tag") a sector for erase, and in the preferred embodiment 100, serve to store a low (de-select) or high (select) value. In the particular arrangement of FIG. 1, each tag register (114-0 to 114-18) receives a sector select signal (SEL0–SEL18), an inverse address signal (A9_), and an internal write enable signal (WE_). In response to these signals, each tag register (114-0 to 114-18) will latch its respective select signal value, or alternatively, clear the register. In the preferred embodiment 100, clearing a register results in the register being forced to a low (de-select) value.

The various sector select signals (SEL0–SEL18) are generated by a sector decoder circuit 116. In the preferred embodiment 100, the sector decoder circuit 116 receives a collection of address signals (A12 to A18), and in response thereto, generates the sector select signals (SEL0–SEL18). In this manner, the preferred embodiment 100 can select sectors for erase by the application of address values (A12–A18).

Referring now to FIG. 2 a block diagram is set forth illustrating a tag register that may be used in the preferred embodiment 100. The tag register is designated by the general reference character 200 and is shown to include a data input (IN), a data output (OUT), a clock input (CLK_), and a reset input (RESET). The tag register 200 will store the data input value in response to a falling edge at its clock input. Once stored, the input data value will be provided at the data output. In addition, when the reset input is high, the tag register 200 will store a low data value and provide it at the data output, resetting any other stored data value. It is noted that in the particular tag register 200 of FIG. 2, high data values, once latched, will remain latched until the register is cleared.

As shown in the figure, when utilized in the embodiment of FIG. 1, the data input will receive one of the sector select signals (shown as SELx) while the data output will provide a corresponding source enable value (shown as ASEN_x). Furthermore, the clock input is driven by the WE_ signal. It is noted that the WE_ signal is received by all tag registers (114-0 to 114-18) in FIG. 1. Therefore when WE_ falls low, the SEL0–SEL18 values will be simultaneously latched by tag registers 114-0 to 114-18, respectively. Also shown in FIG. 2 is the application of the A9_ value to the reset input. Like the WE_ signal, the A9_ value is received by all the tag registers (114-0 to 114-18) in FIG. 1. Thus, when the A9_ value transitions high, the value stored by each of the tag registers (114-0 to 114-18) is simultaneously reset to a low logic value.

Referring now to FIG. 3, a block schematic diagram is set forth illustrating a portion of the preferred embodiment, including two sectors and their corresponding source switches. The portion is designated by the general reference character 300, with the sectors being shown as items 302-0 and 302-1. The source switches are shown as items 304-0 and 304-1.

The sectors (302-0 and 302-1) set forth in FIG. 3 include n-channel one-transistor (1-T) EEPROM memory cells, each designated by the reference character Q100. In the particular arrangement of FIG. 3, the memory cells (Q100) are configured in a "NOR" type memory cell array having rows and columns. Within the same sector (302-0 or 302-1), the drains of the memory cells (Q100) of the same column are commonly connected to the same bit line. Similarly, within the same sector (302-0 or 302-1), the control gates of the memory cells (Q100) of the same row are commonly connected to the same word line. The bit lines and word lines of sector 302-0 are shown as items BL0–BLx and WL0–WLn, respectively. The bit lines and word lines of sector 302-1 are shown as items BL0–BLy and WL0–WLm, respectively. Finally, the sources of each memory cell (Q100) with the same sector (302-0 or 302-1) are connected to one another to form common array sources 306-0 and 306-1.

Figure 4:
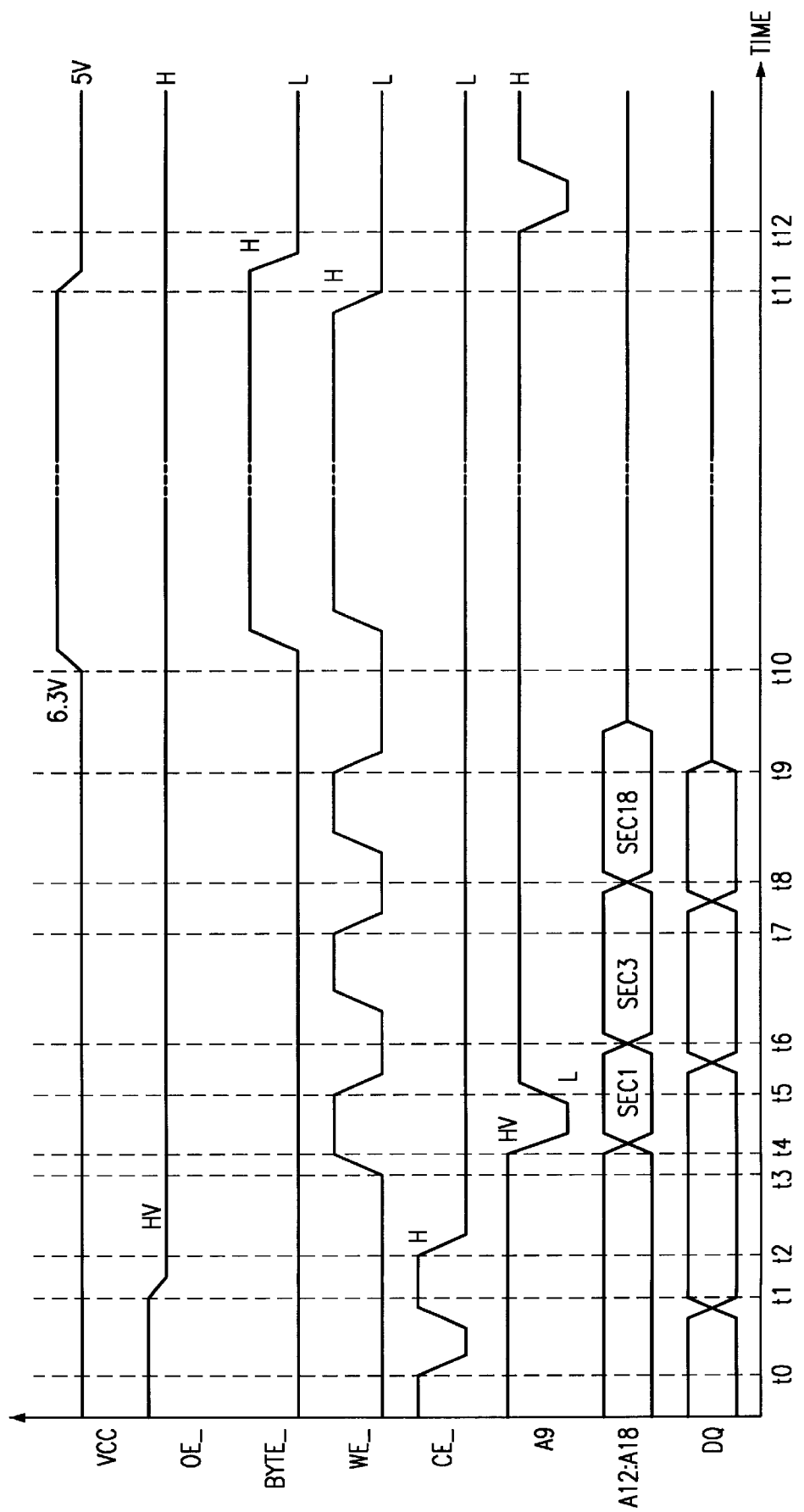
FIG. 4 is a timing diagram illustrating a selective parallel erase operation according to the preferred embodiment.

Having described the general constituents of the preferred embodiment, an example of an erase operation will now be described in conjunction with a timing diagram. Referring now to FIG. 4, a timing diagram is set forth that illustrates the VCC voltage, the WE_ value, the A9 value (which is the inverse of the A9_ value), and the address values A12 to A18. In addition, additional input values to the flash EEPROM are also set forth. These input values include an output enable input (OE_), a data width input (BYTE_), a chip enable input (CE_), and data input/outputs (DQ). These additional inputs provide a way of establishing a mode of operation for the EEPROM.

At time t0, the VCC potential is at a high voltage (approximately +5 volts). At the OE_ input of the flash EEPROM device, a "super" voltage (higher than supply voltage –HV) is applied. The use of the super voltage can have a number of different functions, and typically serves to cause the flash EEPROM to perform some specialized function or enter a specialized mode. As just a few examples, the super voltage at the OE_ input could result in all sectors within the EEPROM being placed in an "unprotected" state. This is in contrast to a "protected" state in which a sector cannot be programmed or erased without a specialized procedure. Alternatively, the super voltage can be used to place the EEPROM into a test mode. As in the case of the OE_ value, the A9 value is also at a super voltage, which can establish a special operation or mode, as mentioned previously. The BYTE_ and WE_ inputs are shown to each receive low values. The CE_ input is strobed low to enable the particular operation or mode resulting from the combination of other input values. The super voltage at the OE_ input will also disable the data I/Os (DQ).

At time t1, the voltage at the OE_ input falls from the super voltage level to a logic high level, ending the particular special function. As just one example, the sectors may all now be unprotected, allowing erase and/or program operations to take place on all sectors. At this time, the CE_ input is high, keeping the flash EEPROM disabled.

At time t2, the CE_ input returns low, enabling the flash EEPROM and allowing commands to be entered and other operations to take place. At this time, the OE_ input remains at a logic high, maintaining the outputs in a disabled state.

At time t3, the WE_ input transitions high, preventing write operations from taking place. Shortly thereafter, at time t4, the A9 value transitions low. The low A9 value in combination with the high OE_ input, high WE_ input, and low BYTE_ input, causes the unique tag register clear operation of the preferred embodiment. If reference is made to FIG. 1, the values at time t4 cause the A9_ signal to go high, simultaneously resetting the values of all the tag registers (114-0 to 114-18). Thus, the timing diagram of FIG. 4 illustrates how a predetermined combination of input signals to the flash EEPROM can clear all of the tag registers of the preferred embodiment, allowing selected sectors to subsequently be tagged for parallel erasure.

Also at time t4, the A12 to A18 values are changed by the application of an external address. The new A12 to A18 values will be used to tag a particular sector for erasure. Referring now to FIG. 1 in conjunction with FIG. 4, In the particular example set forth, the A12 to A18 values are decoded within sector decoder and result in the SEC1 signal going high, which will result in the selection of sector 104-1 for erasure. The A9 value then returns high, ending the tag register clear operation.

At time t5, the WE__ input transitions low, latching the high SEC1 value in tag register 114-1. The high value stored in register 114-1 will remain latched until cleared by a low A9 value. In addition, the high value latched in tag register 114-1 will provide a high source switch enable signal (ASEN__1), which enables source switch 112-1, allowing sector 104-1 to be erased.

At time t6, with the WE__ input returned to a low value and the BYTE__ input still low, the A12 to A18 values change, resulting in the selection of a different sector for erase. In the particular example of FIG. 4, the second set of A12 to A18 values results in the selection of sector 104-3.

At time t7, the WE__ signal transitions low again, and the same general fashion as described in conjunction with time t5, the second sector select value is decoded and a high value latched within the appropriate tag register (112-3).

At times t8 and t9, a third sector select value is applied and latched, resulting in the selection of sector 104-18 for erase. Thus, following time t9, three sectors will have been tagged for parallel erasure, sectors 104-1, 104-3 and 104-18.

At time t10, the VCC voltage level rises to a high level of 6.3 volts. This VCC value will be used to apply the high source voltage required for erase. Shortly thereafter, the BYTE__ and WE__ inputs go high, initiating the erase operation. The erase operation causes the control gates of the memory cells to be driven with the erase voltage −Vgate. At the same time, a positive voltage is applied to the common sources of the tagged sectors (i.e., sectors 104-1, 104-3 and 104-18) due to the tagged registers (114-1, 114-3 and 114-18).

At time t11, the WE__ input returns low, terminating the erase pulse. Shortly thereafter, the BYTE__ input returns low, and the VCC value returns to the high 5 volt value. This terminates the erase pulse, ceasing the parallel erasure of sectors 104-1, 104-3 and 104-18.

At time t12, the A9 value transitions low once again, clearing all of the tag registers (114-0 to 114-18) and thereby allowing a new set of the tag registers (114-0 to 114-18) to be selected for parallel erasure.

The unique parallel erasure of sectors provided by the preferred embodiment 100 allows for increases in device test speed. One possible erase test method is set forth in FIG. 5 in a flow chart. The method is designated by the general reference character 500, and is shown to begin with a tag maximum sector step 502. Step 502 involves selecting a maximum number of sectors for parallel erasure. Provided a flash EEPROM can provide the appropriate voltages for the parallel erasure of all sectors, step 502 would involve tagging all sectors for erasure. However, in the event a smaller number of sectors must be selected, due to limitations in a negative voltage generator or positive source voltage supply circuit, a smaller number of sectors would be tagged. In the case of the preferred embodiment 100, provided the negative voltage generator 108 and VCC supply are capable of erasing every sector, sectors 104-0 to 104-18 when all are tagged for erasure.

Following step 502, the tagged sectors are erased in parallel (step 504). In the case of the preferred embodiment 100, with the −Vgate voltage applied to the control gates of the memory cells, the common array sources will be pulsed with a positive voltage, thereby causing electrons to tunnel from floating gates to the source regions.

Once the initial parallel erase operation has taken place, the erased sectors can be tested (step 506) to ensure that the memory cells have all been properly erased.

The test method 500 will then either end or continue depending upon whether or not all the sectors have been properly erased (step 508). In the ideal case, all sectors will be properly erased, and the test can be concluded. However, when one or more sectors fail the verify erase (step 506), a second erase operation will take place only on those sectors that fail.

Accordingly, when one or more sectors fail the verify erase (step 506) all sectors will be unselected (cleared) for erasure (step 510). In the preferred embodiment 100, the A9__ value will be driven high, resulting in all of the tag registers (114-0 to 114-18) being reset to a low value.

Following the clearing of all sectors (step 510) those sectors that have failed the erase verify step are tagged for a second parallel erase (step 512). In the preferred embodiment 100, selected sectors can be tagged with the procedure illustrated in FIG. 4. Once the second set of sectors have been tagged, the test method is repeated beginning at step 504 until all sectors pass the erase verify step.

The test method of FIG. 5 provides advantages over a chip erase operation, by reducing the possibility of memory cells being over-erased. Rather than apply a single erase pulse or collection of erase pulses that is optimized for the complete erasure of all sectors (and thereby runs the risk of over-erase), the preferred embodiment method can provide an initial erase operation that is more conservative. Thus, rather than risk having to repair over-erased cells (which can consume considerable time), the preferred embodiment method will conduct consecutive erase operations.

The efficacy of the preferred embodiment parallel test has been demonstrated. Given a flash EEPROM device with four sectors, each of 64 kbytes, with an erase pulse duration of 20 ms, the four sectors can be erased in 400 milliseconds. This is in contrast to conventional approaches which can require about one second for each 64 kbyte sectors.

It is understood that the preferred embodiment may be implemented in a standalone device, or an "embedded" memory that is included as one portion of a larger integrated circuit device, such as a microprocessor or microcontroller. Similarly, while the preferred embodiment illustrates a NOR type flash EEPROM, the teachings herein can be applied to other types of memory devices, such as NAND type EEPROMs. In addition, while the preferred embodiment illustrates a particular erase operation (i.e., relatively large negative gate voltage and positive source voltage) the preferred embodiment may be used in conjunction with other types of erase operations. As just one example, flash EEPROMs that apply a high magnitude source voltage while the control gate floats and the drain is in a high impedance state.

It is also understood, that while the operation illustrated by FIG. 4 requires a different set of input values (A12 to A18) to select each sector for a parallel erase, the sector decoder 116 could allow the tagging of multiple sectors with the application of one set of input values.

Thus, while the present invention has been described in detail, it should be understood that various changes, substitutions, and alterations could be made without departing from the spirit and scope of the invention as defined by the appended claims.

What is claimed is:

1. A semiconductor device, comprising:
   a number of sectors, each sector including a plurality of memory cells that store logic values, the memory cells of the same sector being placed in the same logic state by the application of at least one operation voltage to the memory cells of the sector;
   a switch circuit associated with sector that supplies the at least one operation voltage to the memory cells of the sector when enabled; and
   a programmable register circuit associated with switch circuit, the programmable register circuit storing at least a first logic value and a second logic value, each programmable register enabling its associated switch circuit when the programmable register stores the second logic value.

2. The semiconductor device of claim 1, wherein:
   each sector includes a plurality of one-transistor electrically erasable and programmable read only memory (EEPROM) cells, each having a source, a drain, and a control gate.

3. The semiconductor memory device of claim 2, wherein:
   the at least one operation voltage includes a positive voltage; and
   the switch circuit supplies the positive voltage to the sources of the memory cells of its associated sector.

4. The semiconductor memory device of claim 2, further including:
   the at least one operation voltage including a negative voltage; and
   a driver circuit associated with each sector, each driver circuit supplying the negative voltage to the control gates of the memory cells of the sectors.

5. The semiconductor memory device of claim 1, further including:
   a decoder circuit that receives a plurality of address values and supplies logic values to the programmable register circuit.

6. In an electrically programmable and erasable read only memory (EEPROM) having memory cells arranged into a plurality of sectors, a parallel erase scheme, comprising:
   an erase voltage supply;
   a tag register associated with each sector, each tag register storing at least a first logic value and a second logic value;
   an erase voltage path associated with each sector and its associated tag register, each erase voltage path being coupled between its associated sector and the erase voltage supply and being placed in a high impedance state when its associated tag register stores the first logic value and being placed in a low impedance state when its associated tag register stores the second logic value.

7. The parallel erase scheme of claim 6, wherein:
   the tag registers can be simultaneously set to one of the logic values by predetermined input values.

8. The parallel erase scheme of claim 7, wherein:
   the EEPROM receives a plurality of address values; and
   the predetermined input values include at least one address value.

9. The parallel erase scheme of claim 6, further including:
   the EEPROM receives a write enable signal; and
   the tag registers latch logic values when the write enable signal transitions from a first logic level to a second logic level.

10. A method for erasing an electrically erasable and programmable read only memory (EEPROM) that includes a number of memory cells arranged into sectors, the memory cells of the same sector being simultaneously erasable, the method comprising the steps of:
    a) selecting a first group of sectors;
    b) performing an erase operation of the first group of sectors;
    c) testing the first group of sectors for proper erasure;
    d) in the event one or more sectors fails the test, tagging those sectors that fail; and
    e) repeating the process beginning with step b) with the tagged sectors.

11. The method of claim 10, wherein:
    step a) includes applying address values to select the first group of sectors.

12. The method of claim 11, wherein:
    step d) includes applying address values to select those sectors that fail.

* * * * *